United States Patent [19]
Lee et al.

[11] Patent Number: 5,801,395
[45] Date of Patent: Sep. 1, 1998

[54] THIN FILM TRANSISTOR HAVING A BUFFERING PAD LAYER FOR A LIQUID CRYSTAL DISPLAY AND A METHOD FOR MANUFACTURING THE SAME

[75] Inventors: Ju-hyung Lee; Chan-joo Youn, both of Seoul, Rep. of Korea

[73] Assignee: Samsung Electronics Co., Ltd., Kyungki-Do, Rep. of Korea

[21] Appl. No.: 585,314

[22] Filed: Jan. 11, 1996

[51] Int. Cl.$^6$ .................... H01L 29/04; H01L 29/76
[52] U.S. Cl. ........................... 257/57; 257/66
[58] Field of Search ..................... 257/57, 66, 347, 257/412

[56] References Cited

U.S. PATENT DOCUMENTS 5,276,347  1/1994  Wei et al. ............................ 257/412

*Primary Examiner*—Steven H. Loke
*Attorney, Agent, or Firm*—Cushman Darby & Cushman IP Group of Pillsbury Madison & Sutro LLP

[57] ABSTRACT

Disclosed is a thin film transistor (TFT) having a buffering pad layer and a method for manufacturing the same. This TFT is comprised of an active polysilicon pattern formed on a substrate. An oxide film is formed on the active polysilicon pattern. An intrinsic amorphous silicon pattern is formed on the oxide film and a metal pattern on the intrinsic amorphous silicon pattern. The intrinsic amorphous silicon layer serves as a buffering pad. The ion-implantation processes and heat processes are required if other types of silicon were used as a buffering pad.

7 Claims, 2 Drawing Sheets

THIN FILM TRANSISTOR HAVING A BUFFERING PAD LAYER FOR A LIQUID CRYSTAL DISPLAY AND A METHOD FOR MANUFACTURING THE SAME

BACKGROUND OF THE INVENTION

The present invention relates to a thin film transistor for a liquid crystal display device and a method for manufacturing the same, and, more particularly, to a thin film transistor with an intrinsic amorphous silicon layer serving as a battery pad layer which exhibits significantly enhanced insulation characteristics, enabling accurate analysis of bias temperature stress, and a method for manufacturing this type of thin film transistor.

DESCRIPTION OF THE RELATED ART

A liquid crystal display (LCD) has a plurality of transistors each asssociated with a pixel. Each transistor is formed in such a manner that amorphous silicon is deposited on a thin film substrate. Typically, a TN liquid crystal material is used.

In such a twisted nematic typical device, crosstalk is not generated between adjacent pixels because each pixel to which signals are applied when the corresponding TFT is turned ON, but each pixel also has thin film type capacitance. By virtue of this capacitance, the image can be preserved thereafter during nonselected times. This is one of the reasons that the usage of TFT LCDs has increased.

A typical conventional TFT used for an LCD and a method of manufacturing the same are described below with reference to the accompanying drawings.

FIG. 1 shows a conventional TFT that includes an active polysilicon layer 14 displaced over a substrate 12. An oxide layer is formed over the active polysilicon layer 14 to insulate it from the metal gate layer 18 that is formed over oxide layer 16.

As depicted in FIG. 1, a metal having a minute resistance, i.e., Cr, Mo, Ta or TiN or Al is used as a gate to meet the requirements of large scale LCDs. The metal, however, has a disadvantage because a contact surface between a metal gate layer 18 and the gate oxide layer 16 is likely to be formed unevenly compared with a polysilicon gate structure. Further, the insulation and flat band voltage shift characteristics are degraded approximately 20% to 100% compared to a polysilicon gate structure because a reaction between the metal and the oxide film deteriorates the oxide film.

In view of these disadvantages, it has also been proposed to use a structure as illustrated in FIG. 2. FIG. 2 shows another TFT which is like that of the TFT shown in FIG. 1, but further includes a buffering pad layer 20. The buffering pad layer 20 is made from an $N^+$ polysilicon to silicide structure or an $N^+$ polysilicon to metal structure. However, the use of these $N^+$ polysilicon materials requires the use of temperatures above 450° C. Since TFT-LCD processing normally takes place at temperatures required to form such a buffering pad layer 20 have other undesirable consequences. Further, this process can also undesirably require ion-implantation.

SUMMARY OF THE INVENTION

In view of the above, it is an object of the present invention to provide an apparatus and method for obtaining low temperature fabrication of a TFT having a buffering pad made of amorphous silicon that does not require ion-implantation and high temperature heat processing for crystallization.

To achieve the above-mentioned object, the present invention includes a TFT-LCD having a buffering pad which is made of an intrinsic amorphous silicon material. This buffering pad is located between an oxide film that formed over an active polysilicon pattern and a metal pattern.

The method of manufacturing buffering pad includes steps which allow formation of the entire TFT-LCD, including the intrinsic amorphous silicon layer, at temperature below 450° C. Such low temperatures prevent additional undesired electrical characteristics from arising.

BRIEF DESCRIPTION OF THE DRAWINGS

A TFT-LCD having a buffering pad and a method of manufacturing the same according to the preferred embodiment of the present invention will be described with reference to the appending drawings, in which.

DETAILED DESCRIPTION OF THE INVENTION

Figure 1:
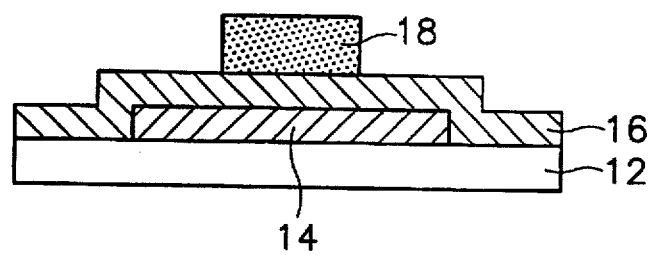
FIG. 1 is a cross-sectional view of a conventional TFT-LCD.
Figure 2:
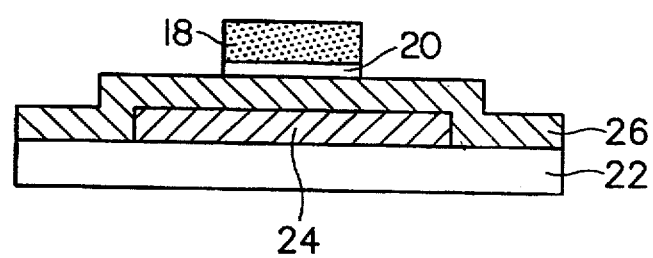
FIG. 2 is a cross-sectional view of another conventional TFT-LCD.
Figure 3:
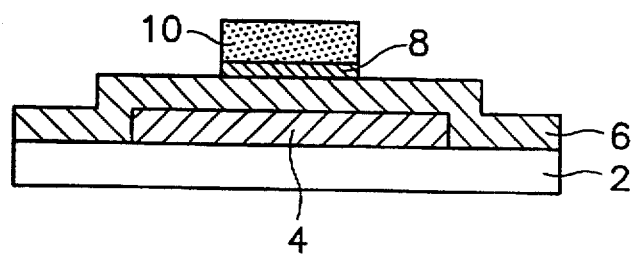
FIG. 3 is a cross-sectional view of a TFT-LCD of the present invention.

FIG. 3 is a cross-sectional view of a TFT-LCD having a buffering pad layer 8 according to the present invention, and FIGS. 4A to 4D show the fabrication process of this portion of the TFT-LCD device.

As shown in FIG. 3, an active polysilicon pattern 4 is disposed on a substrate 2. An oxide film 6 is formed on the active polysilicon pattern 4. A buffering pad layer 8 made from intrinsic amorphous silicon is formed on the oxide film 6. A metal pattern 10 is then formed on the buffering pad layer 8 formed of patterned intrinsic amorphous silicon.

The fabrication process of this portion of the TFT-LCD device is given below.

The process is begun by depositing an active polysilicon (not shown) on a substrate 2 and then photoetching the active polysilicon to create an active polysilicon pattern 4. In this step, it is desirable that the thickness of the active polysilicon pattern 4 end up at about 600 Å.

Figure 4A:
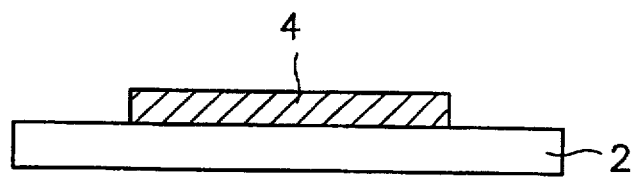
FIGS. 4A to 4D is a process sequence for fabricating the TFT-LCD of FIG. 3.
Figure 4B:
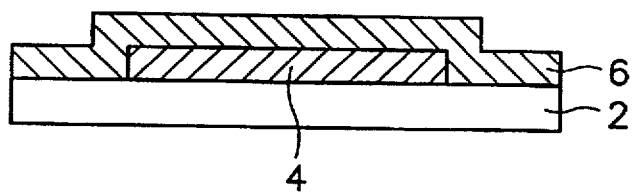

Thereafter, an oxide film 6 is deposited on the active polysilicon pattern 4 as illustrated in FIG. 4B. A desired thickness of the oxide film 6 is about 1,000 Å.

Figure 4C:
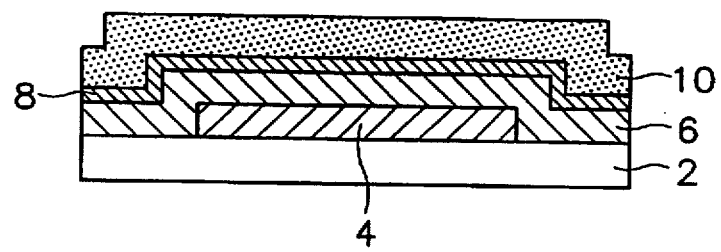

An intrinsic amorphous silicon 8 and metal 10 are then sequentially deposited on the oxide film 6, as illustrated in FIG. 4C. It is desirable that the thickness of the intrinsic amorphous silicon 8 be about 300 Å.

Figure 4D:
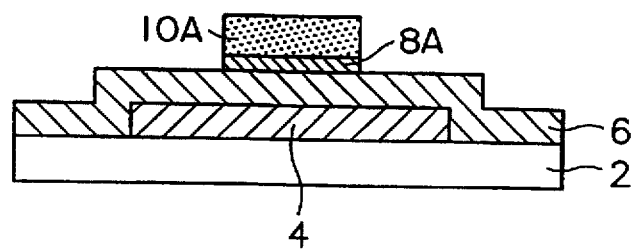

Following the deposition of the intrinsic amorphous silicon 8 and then the metal 10, photoetching of the deposited intrinsic amorphous silicon 8 and metal 10 is then performed at the same time to create the patterned buffering pad layer 8A which is formed of intrinsic amorphous silicon and the metal layer 10A, as illustrated in FIG. 4D.

The main benefits of the resultant TFT-LCD are that the insulation-resistant pressure increases and leakage current decreases because the intrinsic amorphous silicon exists. Thus, the junction between the oxide film 6 and the buffering pad layer 8 made of intrinsic amorphous silicon is formed so that a function of a first degree decreases, reducing a flat band voltage shift. Other effects are that the insulation and bias temperature stressing (BTS) characteristics are enhanced, and the fabrication process can be performed under low temperatures (i.e. below 450° C.) without ion-implantation steps and thermal crystallization steps.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art which this invention pertains.

What is claimed is:

1. A portion of a thin film transistor comprising:

a substrate;

an active polysilicon pattern formed on said substrate;

an oxide film formed over said active polysilicon pattern;

an intrinsic amorphous silicon buffer pad pattern formed at a temperature below 450 degrees Celsius on said oxide film; and a metal pattern formed on said intrinsic amorphous silicon buffer pad pattern.

2. A thin film transistor according to claim 1, wherein said active polysilicon pattern is about 600 Å thick.

3. A thin film transistor according to claim 2, wherein said intrinsic amorphous silicon buffer pad pattern is about 300 Å thick.

4. A thin film transistor according to claim 1, wherein said oxide film is about 1,000 Å thick.

5. A thin film transistor according to claim 4, wherein said intrinsic amorphous silicon buffer pad pattern is about 300 Å thick.

6. A thin film transistor according to claim 5, wherein said active polysilicon pattern is about 600 Å thick.

7. A thin film transistor according to claim 1, wherein said intrinsic amorphous silicon buffer pad pattern is about 300 Å thick.

* * * * *